United States Patent
Young et al.

(10) Patent No.: US 6,429,028 B1
(45) Date of Patent: Aug. 6, 2002

(54) PROCESS TO REMOVE SEMICONDUCTOR CHIPS FROM A PLASTIC PACKAGE

(75) Inventors: Philip Young; Douglas Young; Scott McDaniel, all of Simi Valley; Gary Bivins, Tujunga; William S. Ditto, Chatsworth; Huong Kim Lam, Simi Valley, all of CA (US)

(73) Assignee: DPA Labs, Incorporated, Simi Valley, CA (US)

( * ) Notice: Subject to any disclaimer, the term of this patent is extended or adjusted under 35 U.S.C. 154(b) by 0 days.

(21) Appl. No.: 09/934,647

(22) Filed: Aug. 23, 2001

Related U.S. Application Data
(60) Provisional application No. 60/228,451, filed on Aug. 29, 2000.

(51) Int. Cl.[7] .............................................. H01L 21/00
(52) U.S. Cl. .......................... 438/4; 438/15; 438/112; 438/127
(58) Field of Search .............................. 438/4, 15, 111, 438/112, 123, 127

(56) References Cited

U.S. PATENT DOCUMENTS

| | | | |
|---|---|---|---|
| 3,969,813 A | 7/1976 | Minetti et al. ................ 29/829 |
| 4,012,832 A | 3/1977 | Crane ............................ 438/4 |
| 5,424,254 A | 6/1995 | Damiot ....................... 438/106 |
| 5,436,202 A | 7/1995 | Miura ......................... 228/102 |
| 5,696,033 A | 12/1997 | Kinsman ...................... 29/593 |
| 5,700,697 A | 12/1997 | Diugokecki .................... 438/4 |
| 6,054,012 A | * 4/2000 | Lowry ........................ 156/344 |
| 6,335,629 B1 | * 1/2002 | Lee et al. ................... 324/752 |
| 6,358,852 B1 | * 3/2002 | Li et al. ....................... 216/67 |
| 6,368,886 B1 | * 4/2002 | Van Broekhoven et al. 438/111 |

FOREIGN PATENT DOCUMENTS

| | | |
|---|---|---|
| EP | 413451 | 2/1991 |
| EP | 548603 | 6/1993 |

OTHER PUBLICATIONS

"Electronic Circuits–Preserving Technique for Decapsulating Plastic Packages", IBM Technical Disclosure Bulletin, vol. 30, No. 6, Nov. 1987, pp. 446–447.

* cited by examiner

Primary Examiner—Carl Whitehead, Jr.
Assistant Examiner—Jeff Vockrodt
(74) Attorney, Agent, or Firm—Richard C. Litman

(57) ABSTRACT

A process to remove a semiconductor die from a plastic package and then to reassemble the die in a high reliability hermetic package. The process is used to remove an already existing die using a unique disassembly and etching process and make the removed die more reliable by reattaching the die and rebonding all new die wires into either a hermetic package or a different type of package with a "bond-on-top-of-bond" technique. The original bondfoot on the removed die may be first preconditioned by a novel bond-flattening tool, which can be attached to the bond-head chuck of any wirebonder. Also, the die can be used in other applications with different pin-outs or configurations.

20 Claims, 4 Drawing Sheets

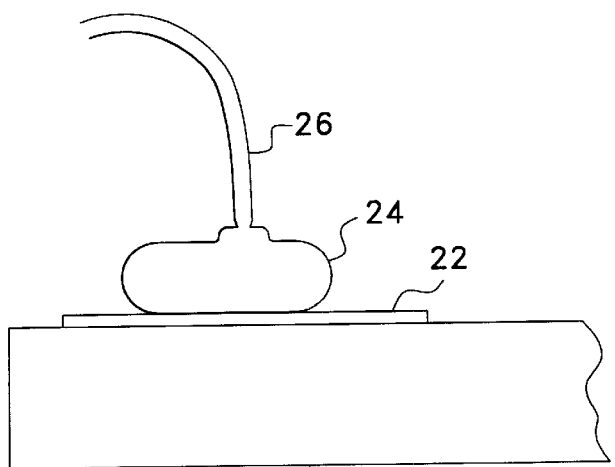
*Fig. 3A*
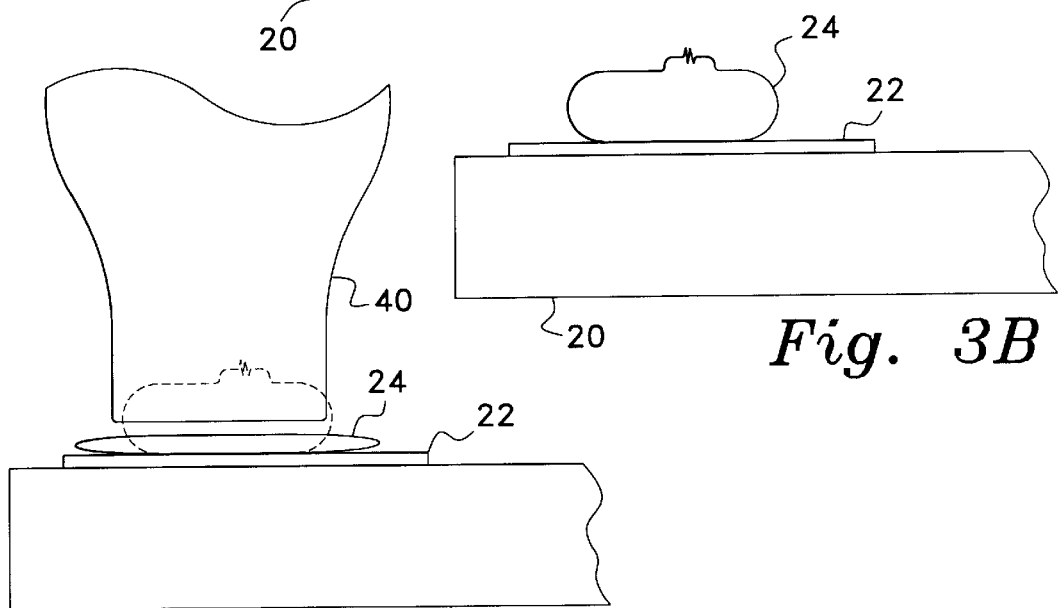
*Fig. 3B*
*Fig. 3C*
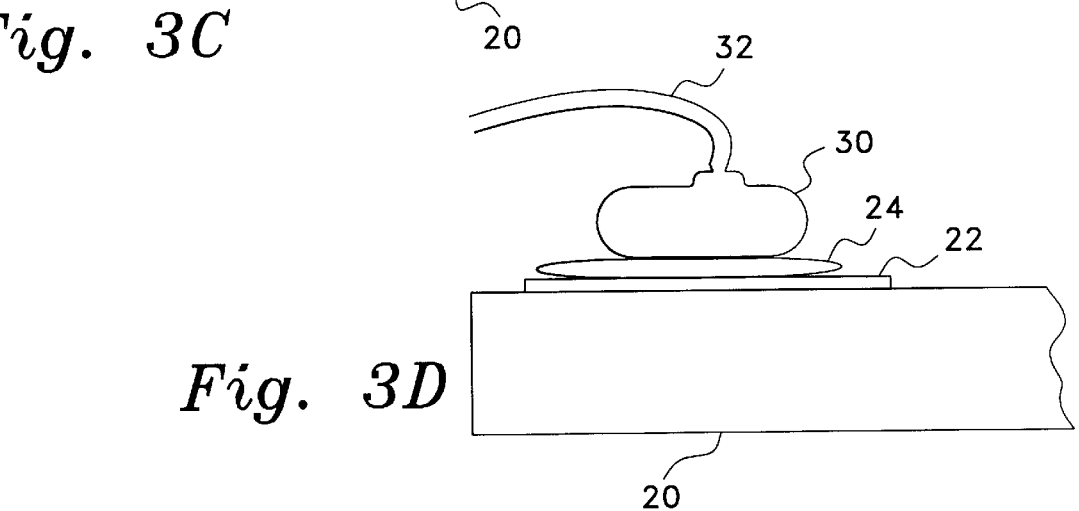
*Fig. 3D*

PROCESS TO REMOVE SEMICONDUCTOR CHIPS FROM A PLASTIC PACKAGE

CROSS-REFERENCE TO RELATED APPLICATION

This application claims the benefit of U.S. Provisional Patent Application Ser. No. 60/228,451, filed Aug. 29, 2000.

Background of the Invention

1. Field of the Invention

The present invention relates to the field of semiconductors and, more particularly, to a method and associated apparatus for removing semiconductor chips (die) from a plastic encapsulated package and reassembling the removed die in a high reliability hermetic package.

2. Description of Related Art

Semiconductor devices in the form of integrated circuits are used in virtually all electronic devices. A typical integrated circuit includes a die formed of silicon with transistors and other active and passive devices formed on the silicon. The integrated circuit is typically included in an integrated circuit package. The package typically provides for the die electrical interconnection, mechanical support, heat dissipation, and protection. Most integrated circuit packages include a leadframe which carries the external connection pins, wire bonds between the leadframe and the die, and an encapsulant. The encapsulant is typically a plastic which is molded around the other components and cured during manufacturing to thereby protect the encapsulated components from the ambient environment. Ceramics are used in some applications as the encapsulating material, but are more expensive and require higher energy processing as compared to plastics.

For new system designs, system engineers are often faced with using non-hermetic commercial temperature plastic encapsulated microcircuits in assemblies and environments for which they were not designed. This can create problems not previously encountered when high reliability devices were available. For example, a plastic device may outgas in the vacuum of space or absorb moisture in a high humidity environment. A commercial grade part may not function as designed when operating between the military temperature ranges of −55° to +125° C.

Even worse, a commercial-off-the-shelf device obsolescence issue may involve an expensive system redesign if a suitable alternative part is not a direct replacement in fit, form, and function. Additional screening and testing may also be necessary to achieve the desired level of confidence in the devices' long term reliability.

One solution to this growing problem is to procure the bare die, perform custom packaging, and test the devices to meet outer space or military requirements. However, many times the die is not available, and fabricating new wafers may be quite costly, especially when small quantities are desired. The present invention is a process for de-encapsulating plastic encapsulated microcircuits that provides a much needed solution to this problem. This process uses plastic encapsulated microcircuits as a source of die when the bare die is not available.

The concept behind the present invention is to remove the active circuit in die form from an already existing plastic encapsulated device. The die can then be reassembled into a high reliability hermetic package (such as ceramic or the like). To the military user, this provides the advantages of a larger source of die while providing the final product in the desired package and reliability level. This same process can also be used to re-encapsulate a recovered die into a different package configuration, thus providing much needed flexibility in achieving fit, form, and function.

The related art is represented by the following patents of interest.

U.S. Pat. No. 3,969,813, issued on Jul. 20, 1976 to Richard H. Minetti et al., describes a method and apparatus for removal of defective semiconductor chips from hybrid integrated circuits. U.S. Pat. No. 4,012,832, issued on Mar. 22, 1977 to John R. Crane, describes a method and apparatus for removing integrated circuit devices from their circuit environment in a manner which does not destroy or affect the circuit environment or the device being removed.

U.S. Pat. No. 5,424,254, issued on Jun. 13, 1995 to Pascale Damiot, describes a method for recovering bare semiconductor chips from plastic packaged modules which is not detrimental to the chip functionality and testability. U.S. Pat. No. 5,436,202, issued on Jul. 25, 1995 to Shinya Miura, describes a sealing method and apparatus which can hermetically seal a semiconductor package with excellent gas tightness.

U.S. Pat. No. 5,696,033, issued on Dec. 9, 1997 to Larry D. Kinsman, describes a method for packaging semiconductor dies. U.S. Pat. No. 5,700,697, issued on Dec. 23, 1997 to Joseph J. Diugokecki, describes a reconstructed plastic or other package, and a method of reconfiguring any prefabricated integrated circuit package (with or without an existing silicon chip and wires inside) so that an integrated circuit die can be installed and interconnected for normal use.

European Patent No. 413,451, published on Feb. 20, 1991, describes a semiconductor device which takes less volume than known packages and preferably can provide improved heat dissipation compared to the prior art. European Patent No. 548,603, published on Jun. 30, 1993, describes a method for replacing a semiconductor chip bonded face down to a substrate and encapsulated by a resin.

An article entitled ELECTRONIC CIRCUITS—PRESERVING TECHNIQUE FOR DECAPSULATING PLASTIC PACKAGES, published in November 1987 on pages 446 and 447 of IBM Technical Disclosure Bulletin, Volume 30, Number 6, describes a method for replacing a semiconductor chip bonded face down to a substrate and encapsulated by a resin.

None of the above inventions and patents, taken either singly or in combination, is seen to describe the instant invention as claimed.

SUMMARY OF THE INVENTION

The present invention is a method and associated apparatus in which a semiconductor chip (die) is removed from a plastic encapsulated package and reassembled into a high reliability hermetic package. The process is used to remove an already existing die using a unique disassembly and etching process and make the removed die more reliable by reattaching the die and rebonding the die wires into either a hermetic package or a different type of package. Also, the die can be used in other applications with different pin-outs or configurations.

The process begins by preparing an integrated circuit package for completely removing the die from the package. Such an integrated circuit package preferably includes a plastic encapsulant having a topside and a backside surrounding a leadframe carrying a bottom die-mount heatsink (or "paddle"), external pins, an integrated circuit die, and gold bondwires extending between the leadframe posts and the aluminum die bondpads. The integrated circuit package is prepared for a backside grind procedure by first removing the external leads. This can be done by cutting or grinding. The backside of the integrated circuit package plastic encapsulant is subsequently mechanically milled or ground away from backside of the device until the copper heatsink/paddle begins to appear. The remaining copper paddle from the backside of the die is then completely chemically dissolved by immersing the integrated circuit assembly in a beaker with 70% nitric acid and partially immersing the beaker in an ultrasonic agitation bath which greatly enhances the etching process. Any conventional ultrasonic cleaner can be used for this process. This process can be further accelerated with heat.

A backside selective chemical etch is then performed to remove die-attach medium/residue on the back surface of the die. Some die-attach adhesive or residue may remain after the copper is dissolved from the backside of the die. A backside etch, using a heated jet-stream of either 90% red fuming nitric acid or 90% yellow fuming nitric acid, for approximately ten seconds may be used to help clean the backside of the die. If a backside etch is used, care should be taken not to over-etch and thus undercut to the topside of the die surface and thereby expose the die bondpads to acid longer than necessary.

The device is then inverted and the topside of the plastic encapsulant is subjected to a localized etch at the die area, using a heated (+90° C.) jet-stream of either 90% red fuming acid or 90% yellow fuming nitric acid for about one to three minutes, followed by a cold (+25° C.) jet-stream rinse of the same acid for about twenty seconds. A glass eye-dropper or pipette can be used to produce the directed jet-stream at the localized area of interest. 20% sulfuric acid may be added to the nitric acid for some types of plastics. The mix proportion and duration of the etch is determined by the compound and the thickness of the encapsulant. To reduce etch time, a topside grinding/milling operation may first be performed to thin down the encapsulation immediately above the die area prior to the localized acid etch. After the topside package etch is complete, there should be a cavity completely through the plastic package wherein the die is left hanging in place by only its bondwires connected to the leadframe posts. All edges of the die should be free of encapsulation. Immediately following the cold acid rinse, the suspended die is rinsed with a squirt of acetone, then the entire remaining integrated circuit is immersed in a beaker of acetone and subjected to ultrasonic agitation for about one minute.

The die is finally cleaned to remove encapsulation residue by placing the device in a beaker of N-methyl-2-pyrrolidinone and subjecting the beaker to ultrasonic agitation for about ten to fifteen minutes. Subsequently, the die is rinsed with acetone.

Removal of the gold bondwires is achieved by using a pair of tweezers to hold on to the mid-span of each wire and with a rotational motion, twist the wires in such a manner as to fatigue the wire at the "neckdown" area of the die ball-bond until the wire breaks off, leaving the ball-bond intact at the die-pad. Care must be taken to exert the least amount of vertical tension to the ball-bonds so as not to lift the balls off the delicate aluminum die-pads. Excessive vertical tension can result in lifting of the ball-bond and possibly tearing or lifting of the bondpad metallization. To speed up the wire removal process, all wires can be simultaneously pre-fatigued by holding the exposed die with tweezers by its edges and rotating the die both clockwise and counterclockwise repeatedly before twisting off the wires at the neckdown area. An alternate method to pre-fatigue the wires is to continuously hold the exposed die with tweezers by its edges while the rest of the integrated circuit assembly is immersed in an ultrasonic agitation bath for about thirty seconds. If this method is employed, the integrated circuit body should be in contact with the bottom of the beaker to minimize any vertical tension on the ball bonds while the wires are being pre-fatigued in the horizontal direction by the ultrasonic agitation. The complete removal of the die from the plastic package thus is achieved without inducing any electrostatic discharge, chemical, or mechanical damage.

Once the die has been removed from the plastic encapsulation the die is inserted into a hermetic package or a different type of package and reattached to the new package by first re-attaching the die to the floor of the package and then rebonding new wires between the removed die and the new package. The re-attaching of the die may be accomplished by the use of conductive or non-conductive epoxy, silver glass epoxy, or eutectic attach methods. The re-connection of the wires between the die and the new package is achieved by bonding new thermosonic/thermocompression ball-bonds or ultrasonic wedge bonds on top of the original gold ball-bonds left at the bondpads of the die. This "bond-on-top-of-bond" technique can be either performed on an automated bonder or a manual wire bonder by readjusting the power, time, and force to obtain the maximum pull-strength without damaging the existing old ball-bonds or aluminum bondpads on the die. In order to facilitate the bonding targeting process and to increase adhesion, the original ball-bond on the die may be first flattened to increase the diameter of the ball, making it easier to target the new bond. A novel bondtool without a capillary may be used for this process. The ball-flattening process should be performed at a temperature of +175° C. to optimize malleability of the gold and to minimize the effects of Kirkendall voiding.

Accordingly, it is a principal object of the invention to provide a process to remove a die from a plastic package.

It is another object of the invention to provide a process to remove a die from a plastic package and then to reassemble the die in a high reliability hermetic package.

It is further object of the invention to provide a process to remove all the wires from an exposed die in an integrated circuit without removing the bondfoot (gold ball) at any of the diepads. The removal of the wire without removing the bondfoot leaves the aluminum bondpad intact and undamaged and thus available for rebonding.

Still another object of the invention is to provide a process to reconnect some or all of the pads of a removed die to the new package by a "bond-on-top-of-bond" technique utilizing the original bondfoot as the new "pad" upon which to bond a new wire.

Another object of the invention to provide a process to flatten the original bondfoot with a new tool to increase the targeting area for the new bonds and to increase the adhesion between the new ball bond and the old ball bond. The flattened bondfoot, due to its increased bonding area and flatness, serves to both increase the adhesion between itself and the aluminum bondpad beneath as well as with the new ball bond above.

Another object of the invention to provide a new bond-flattening tool made of ceramic or metal which can be inserted into capillary chucks of existing automatic or manual wirebonders for precision targeting and manual/automatic operation.

A further object of the invention to provide a process to remove a die from a plastic package without inducing any electrostatic discharge, chemical, or mechanical damage.

It is an object of the invention to provide improved elements and arrangements thereof in a process to remove semiconductor chips from a plastic package for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

FIG. 3A is a fragmented end view of a semiconductor die, bondwire, gold ball bond, and aluminum bondpad immediately prior to removal of bondwires according to a second example of the invention.

FIG. 3B is a fragmented end view of a semiconductor die, and gold bondfoot, and aluminum bondpad immediately prior to flattening of the bondfoot according to the second example of the invention.

FIG. 3C is a fragmented end view of a flattened bondfoot after being flattened with a bond-head tool according to the second example of the invention.

FIG. 3D is a fragmented end view of a semiconductor die with "bond-on-top-of-bond" after re-attaching new wires in a new package according to the second example of the invention.

Similar reference characters denote corresponding features consistently throughout the attached drawings.

DETAILED DESCRIPTION OF THE PREFERRED EMBODIMENT

Figure 1A:
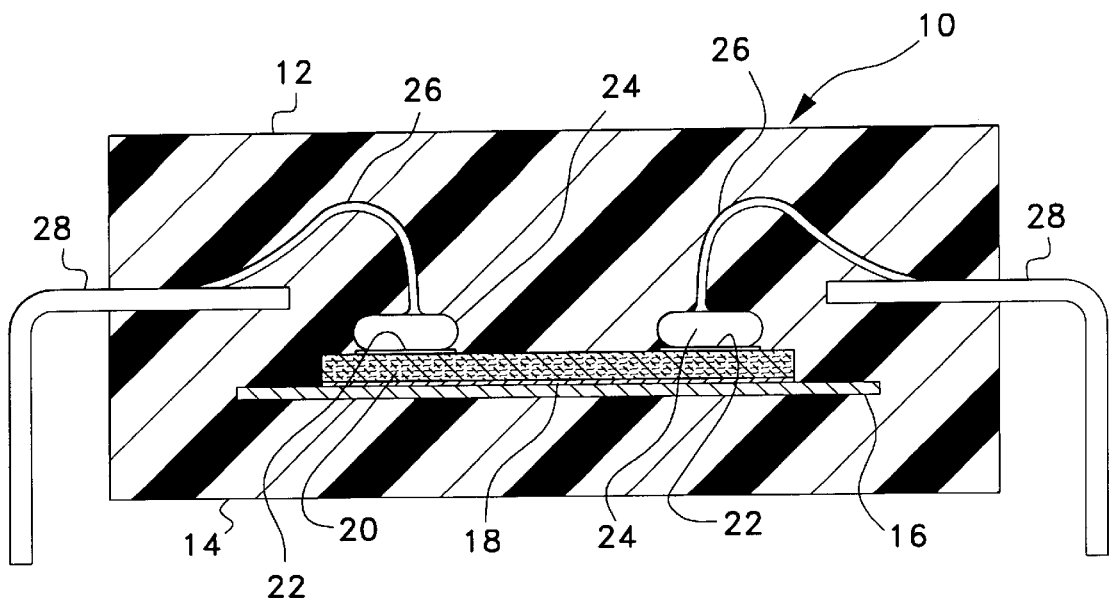
FIG. 1A is a cross-sectional view of a semiconductor chip encapsulated in a plastic package.

The present invention is a method and associated apparatus in which a semiconductor chip (die) is removed from a plastic encapsulated package and reassembled into a high reliability hermetic package. The invention disclosed herein is, of course, susceptible of embodiment in many different forms. Shown in the drawings and described hereinbelow in detail is a preferred embodiment of the invention. It is to be understood, however, that the present disclosure is an exemplification of the principles of the invention and does not limit the invention to the illustrated embodiment.

The users of the product obtained using this process are those who require electronics in high reliability applications (i.e. military, space, etc.). Presently, many of these semiconductor chips only exist in encapsulated plastic packages, however, these available plastic encapsulated devices may not have the reliability or fit-form-function necessary for every end user's particular application (i.e. temperature, high humidity, corrosive atmosphere, mechanical stress, different pin-out, configuration, etc.). Although the present immediate need is for the removed die to be used in high reliability applications and hermetic packages, the die which has been removed by this process can also go into low reliability, non-hermetic packages or applications.

As shown in FIG. 1A, an integrated circuit package 10 is shown which includes a plastic encapsulant having a topside 12 and a backside 14 surrounding a leadframe carrying external pins 28, a copper die-mount heatsink (or "paddle") 16, an integrated circuit die 20, and bond wires 26 extending between the leadframe posts and the aluminum bondpads 24 on the die 20, as would be readily appreciated by those skilled in the art. The entire leadframe base material is usually made of nickel-plated copper for good heat and electrical conduction. The bondwires 26 (generally 1.0 millimeters in diameter and 99.9% gold) are usually made with thermosonic or thermocompression ball bonds 24 on the die pads 22 at one end and a crescent bond on the leadframe posts at the other end. The integrated circuit package 10 is prepared for a backside grind procedure by first removing the pins 28 external to the package. This can be done by cutting or grinding.

Figure 1B:
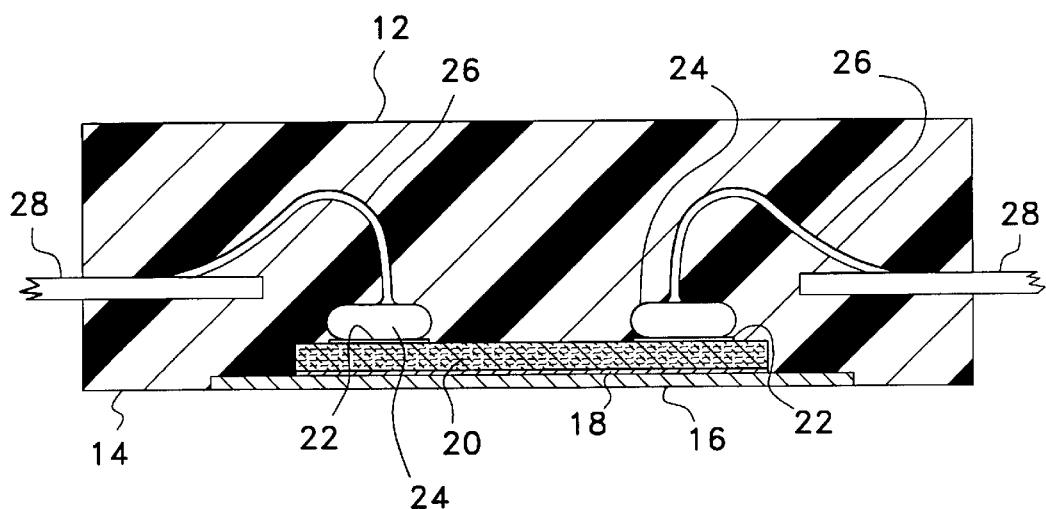
FIG. 1B is a cross-sectional view of a plastic encapsulated semiconductor chip wherein the back layer of the plastic package has been ground away exposing the bottom copper die mounting paddle according to the invention.

Referring to FIG. 1B, the backside 14 of the integrated circuit package plastic encapsulant 10 is subsequently mechanically milled or ground away from back 14 of the device 10 until the copper of the die mount heatsink/paddle 16 begins to appear. The remaining copper paddle 16 from the backside of the die 20 is then completely chemically dissolved by immersing the integrated circuit assembly in a beaker with 70% nitric acid and partially immersing the beaker in an ultrasonic agitation bath which greatly enhances the etching process. Any conventional ultrasonic cleaner can be used for this process. This process can be further accelerated with heat.

Figure 1C:
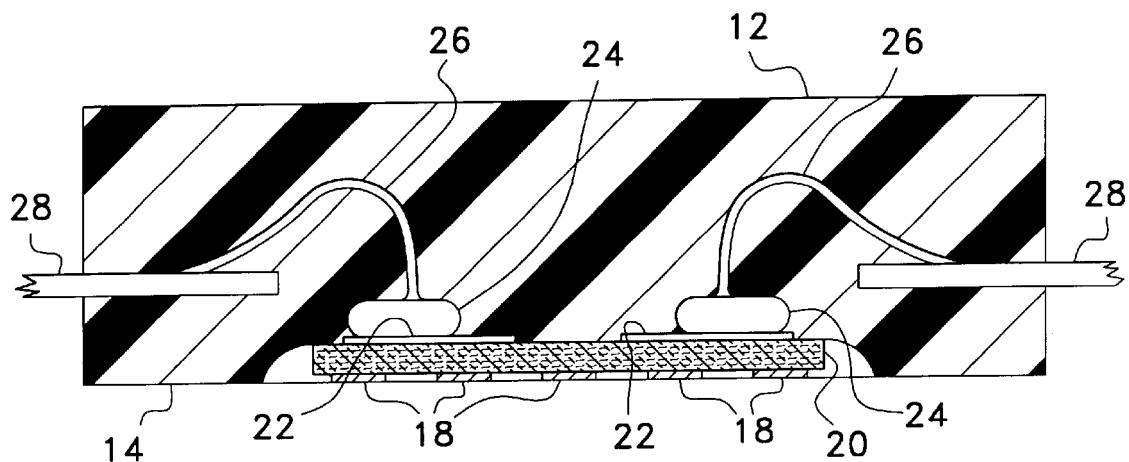
FIG. 1C is a cross-sectional view of a plastic encapsulated semiconductor chip wherein the copper die mounting paddle has been chemically dissolved according to the invention.

Referring to FIG. 1C, a backside selective chemical etch is then performed to remove die-attach medium/residue 18 on the back. Some die-attach residue 18 may remain after the copper die-mount paddle is dissolved from the backside of die 20. A backside etch, using a heated jet-stream of either 90% red fuming nitric acid or 90% yellow fuming nitric acid, for approximately ten seconds may be used to help clean the backside of the die 20. If a backside etch is used, care should be taken not to over-etch and thus undercut to the topside of the die surface and thereby expose the die bond pads 22 to acid longer than necessary.

Figure 1D:
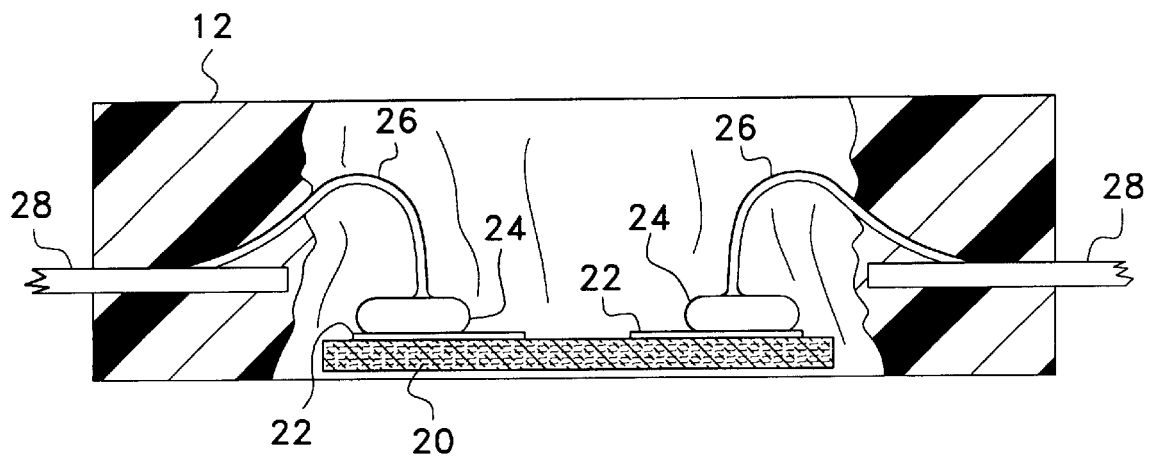
FIG. 1D is a cross-sectional view of a plastic encapsulated semiconductor chip wherein the top layer of the plastic package has been removed, leaving the die suspended only by its bondwires according to the invention.
Figure 1E:
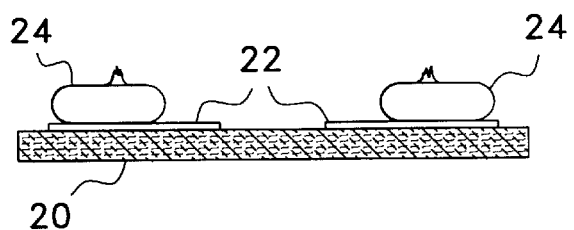
FIG. 1E is a cross-sectional view of a semiconductor chip wherein all its wires have been removed, leaving only the ball bonds on the diepads.

The topside plastic 12 of the device 10 is then pre-thinned down by grinding or milling. The device is then inverted and, as shown in FIG. 1D, the topside of the plastic encapsulant is subjected to a localized etch at the die area, using a heated (+90° C.) jet-stream of either 90% red fuming nitric acid or 90% yellow fuming nitric acid for about one to three minutes, followed by a cold (+25° C.) jet-stream rinse of the same acid for about twenty seconds. A glass eyedropper or pipette can be used to produce the directed jet-stream at the localized area of interest. 20% sulfuric acid may be added to the nitric acid for some types of plastics. The mix proportion and duration of the etch is determined by the compound and the thickness of the encapsulant. To reduce etch time, a topside grinding/milling operation may first be performed to thin down the encapsulation immediately above the die area prior to the localized acid etch. After the topside package etch is complete, there should be a cavity completely through the plastic package wherein the die 20 is left hanging in place by only its bondwires 26 connected to the leadframe posts. All edges of the die 20 should be free of encapsulation. Immediately following the cold acid rinse, the suspended die is rinsed with a squirt of acetone. The entire remaining integrated circuit is then immersed in a beaker of acetone and subjected to ultrasonic agitation for about one minute. The die 20 is finally cleaned to remove encapsulation residue by placing the device in a beaker of N-methyl-2-pyrrolidinone and subjecting the beaker to ultrasonic agitation for about ten to fifteen minutes. Subsequently, the die is rinsed with acetone. Thereafter the bondwires 26 are severed, as described below, leaving the die 20 as shown in FIG. 1E.

Figure 2A:
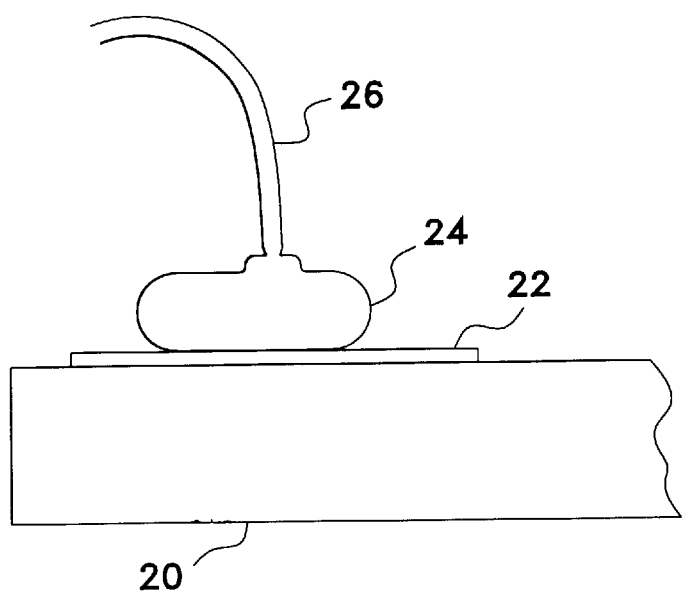
FIG. 2A is a fragmented end view of a semiconductor die, bondwire, gold ball bond, and aluminum bondpad immediately prior to removal of bondwires according to the first example of the invention.
Figure 2B:
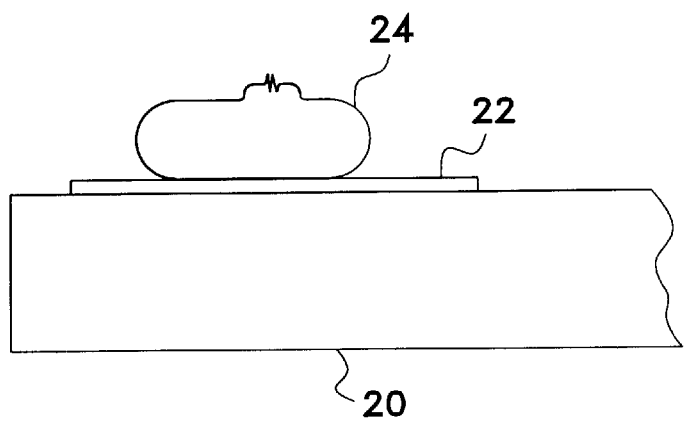
FIG. 2B is a fragmented end view of a semiconductor die, and gold bondfoot, and aluminum bondpad immediately following removal of bondwires according to the first example the invention.

Referring to FIGS. 2A and 2B, removal of the gold bondwires 26 is achieved by using a pair of tweezers to grab hold of the mid-span of each wire and with a rotational motion, twist the wires in such a manner as to fatigue the wire at the "neckdown" area of the die ball bond 24 until the wire 26 breaks off, leaving the ball bond 24 intact at the die-pad 22. Care must be taken to exert the least amount of vertical tension to the ball bonds 24 so as not to lift the balls off the delicate aluminum die-pads 22. Excessive vertical tension can result in lifting of the ball bond 24 and possibly tearing or lifting of the bondpad metallization. To speed up the wire removal process, all wires 26 can be simultaneously pre-fatigued by holding the exposed die 20 with tweezers by its edges and rotating the die 20 both clockwise and counterclockwise repeatedly before twisting off the wires 26 at the neckdown area. An alternate method to pre-fatigue the wires 26 is to continuously hold the exposed die 20 with tweezers by its edges while the rest of the integrated circuit assembly is immersed in an ultrasonic agitation bath for about thirty seconds. If this method is employed, the integrated circuit body should be in contact with the bottom of the beaker to minimize any vertical tension on the ball bonds 24 while the wires 26 are being pre-fatigued in the horizontal direction by the ultrasonic agitation. The complete removal of the die 20 from the plastic package, as shown in FIG. 1E, thus is achieved without inducing any electrostatic discharge, or chemical or mechanical damage.

Figure 2C:
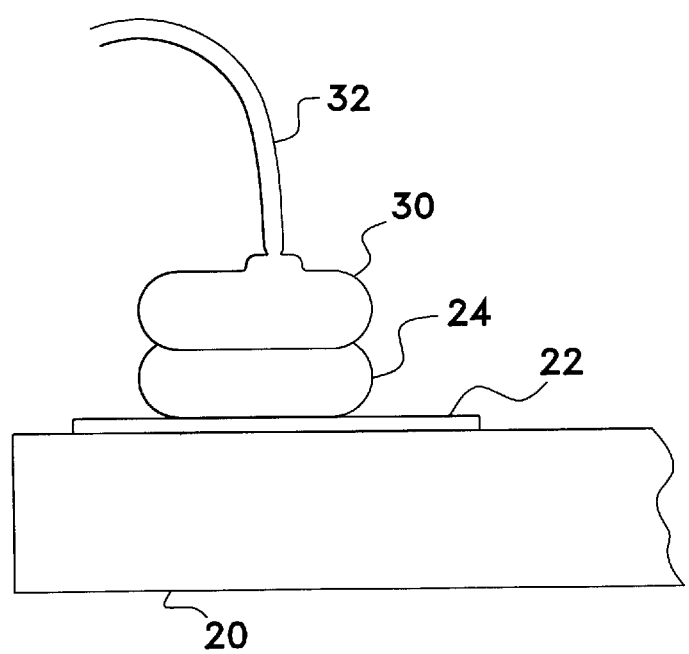
FIG. 2C is a fragmented end view of a semiconductor die with "bond-on-top-of-bond" after re-attaching new wires in a new package according to the first example of the invention.

Once the die 20 has been removed from the plastic encapsulation the die 20 is inserted into a hermetic package or a different type of package and reattached to the new package by first re-attaching the die 20 to the floor of the package and then rebonding new wires between the removed die 20 and the new package. The re-attaching of the die 20 may be accomplished by the use of conductive or non-conductive epoxy, silver glass epoxy, or eutectic attach methods. The re-connection of the wires between the die and the new package is achieved by bonding new thermosonic/thermocompression ball bonds 30 or ultrasonic wedge bonds on top of the original gold ball bonds 24 left at the bondpads 22 of the die 20. This "bond-on-top-of-bond" technique can be either performed on an automated bonder or a manual wire bonder by readjusting the power, time, and force to obtain the maximum pull-strength without damaging the existing old ball bonds 24 or aluminum bondpads 22 on the die. As shown in FIGS. 2C and 3D, this rebonding is achieved by bonding the new bondwires 32 to the original ball bond 24.

Referring to FIGS. 3A–3C, in order to facilitate the bonding targeting process and to increase adhesion, the original ball bond 24 on the die 20 may be first flattened to increase the diameter of the ball, making it easier to target the new bond. A novel bondtool 40 without a capillary may be used for this process. Such a bond-flattening tool is preferably made of ceramic or metal which can be inserted into capillary chucks of existing automatic or manual wire-bonders for precision targeting and manual/automatic operation. The ball-flattening process should be performed at a temperature of +175° C. to optimize malleability of the gold and to minimize the effects of Kirkendall voiding.

The invention provides the ability to remove a die 20 without damaging the delicate circuitry and reassembling the recovered die 20 into a different package than that available in plastic. The benefits of this process allow the end user to use an already encapsulated obsolete die and new technologies in a different type of package.

It is to be understood that the present invention is not limited to the sole embodiment described above, but encompasses any and all embodiments within the scope of the following claims.

We claim:

1. A process for removing a die from an integrated circuit plastic package, the package including a plastic encapsulant having a topside and a backside surrounding a leadframe carrying external pins, an integrated circuit die, a copper die-mount paddle, and bondwires extending between the leadframe and bondpads on the die, the process comprising the steps of:
   (a) removing the pins;
   (b) grinding away the backside of the integrated circuit package plastic encapsulant until the copper of the die-mount heatsink paddle begins to appear;
   (c) removing any remaining copper paddle from the backside of the die by placing the die in a beaker with heated 70% nitric acid while agitating the beaker in an ultrasonic bath;
   (d) performing a backside etch to remove any die-attach residue from the die;
   (e) etching the topside of the die with 90% fuming nitric acid in order to remove the topside plastic;
   (f) rinsing the die with acetone;
   (g) clean the die by placing the integrated circuit with the exposed die in a beaker of N-methyl-2-pyrrolidinone while subjecting the beaker to ultrasonic agitation; and
   (h) rinsing the die with acetone.

2. The process for removing a die according to claim 1, further comprising the step of twisting off each bondwire with tweezers at the neckdown area without removing a bondfoot from the bondpad.

3. The process for removing a die according to claim 2, further comprising the step of inserting the die into a new package after the step of twisting off each bondwire.

4. The process for removing a die according to claim 3, further comprising the step of attaching the die to a floor of the new package.

5. The process for removing a die according to claim 4, wherein the step of attaching the die further comprises epoxying the die to the floor of the new package.

6. The process for removing a die according to claim 4, wherein the step of attaching the die further comprises forming a eutectic attachment of the die to the floor of the new package.

7. The process for removing a die according to claim 4, further comprising the step of connecting new wires between the die and the new package by bonding new die wires between the die and the new package.

8. The process for removing a die according to claim 3, further comprising the step of bonding new bondwires to the original ball-bond with a "bond-on-top-of-bond" process, the "bond-on-top-of-bond" process including forming a new ball-bond on top of the original ball bond, in order to establish electrical contact between the die and the new package.

9. The process to remove a die from a plastic package according to claim 8, wherein the "bond-on-top-of-bond" process further comprises the step of flattening the original ball-bond in order to increase a targeting/bonding area and adhesion to both the die-pad and the new ball-bond.

10. The process to remove a die from a plastic package according to claim 9, wherein the step of flattening the original ball bond further comprises inserting a flattening tool into a wirebonder chuck for repeatable precision targeting and automation.

11. The process for removing a die according to claim 3, wherein the new package is a hermetic package.

12. The process for removing a die according to claim 1, wherein the step of etching the topside of the die is performed with a fuming nitric acid selected from the group consisting of 90% red fuming nitric acid and 90% yellow fuming nitric acid.

13. The process for removing a die according to claim 1, wherein the step of etching the topside of the die further comprises etching the topside of the die with a mixture of 20% sulfuric acid and fuming nitric acid.

14. The process for removing a die according to claim 1, further comprising the step of pre-thinning the topside plastic by grinding or milling prior to performing step (e).

15. The process for removing a die according to claim 1, wherein the pins are removed by cutting.

16. The process for removing a die according to claim 1, wherein the pins are removed by grinding.

17. The process f or removing a die according to claim 1, wherein the step of performing a backside etch further comprises etching the backside with an acid selected from the group consisting of 90% red fuming nitric acid and 90% yellow fuming nitric acid for about ten seconds.

18. The process for removing a die according to claim 1, wherein the step of etching the topside plastic further comprises etching the topside plastic with a jet-stream of the fuming nitric acid.

19. The process for removing a die according to claim 18, wherein the step of etching the topside plastic with the jet-stream is performed for between about one to three minutes, the fuming nitric acid being heated to about 90° C.

20. The process for removing a die according to claim 19, further comprising the step of rinsing the topside with a cold jetstream of the nitric acid at a temperature of about 25° C. for about twenty seconds immediately following the step of etching the topside plastic.

* * * * *